United States Patent
Chu et al.

(10) Patent No.: US 6,410,974 B2
(45) Date of Patent: Jun. 25, 2002

(54) SIMPLIFIED HIGH Q INDUCTOR SUBSTRATE

(75) Inventors: Jerome Tsu-Rong Chu, Orlando, FL (US); John D. LaBarre, Walnutport, PA (US); Wen Lin, Allentown, PA (US); Blair Miller, New Ringgold, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/800,049

(22) Filed: Mar. 5, 2001

Related U.S. Application Data

(62) Division of application No. 09/386,132, filed on Aug. 30, 1999, now Pat. No. 6,225,182.

(51) Int. Cl.$^7$ .......................... H01L 29/76; H01L 21/20
(52) U.S. Cl. .................... 257/531; 257/328; 438/369
(58) Field of Search ...................... 257/408, 403, 257/398, 399, 328, 335, 336; 438/369, 381

(56) References Cited

U.S. PATENT DOCUMENTS

| | | | |
|---|---|---|---|
| 3,878,001 A | * | 4/1975 | Olk .............................. 257/14 |
| 4,224,631 A | | 9/1980 | Vickery et al. |
| 5,479,037 A | * | 12/1995 | Hshieh et al. ............... 257/328 |
| 5,712,501 A | | 1/1998 | Davies et al. |
| 5,734,194 A | | 3/1998 | Sanders et al. |
| 5,933,733 A | | 8/1999 | Ferla et al. |
| 6,020,611 A | | 2/2000 | Ma et al. |
| 6,064,088 A | * | 5/2000 | D'Anna ...................... 257/341 |
| 6,093,951 A | * | 7/2000 | Burr ............................ 257/408 |

* cited by examiner

Primary Examiner—David Nelms
Assistant Examiner—Thao P Le

(57) ABSTRACT

The present invention provides for a method of manufacturing a simplified high Q inductor substrate and a semiconductor device having that substrate. The method for manufacturing the simplified high Q inductor substrate preferably includes forming a base substrate over a semiconductor wafer, wherein the base substrate has a given dopant concentration and then forming an epitaxial (EPI) layer over the base substrate. The EPI layer includes epitaxially forming a first doped region in the EPI layer over the base substrate and then epitaxially forming a second doped region in the EPI layer over the first doped region. The first doped region has a dopant concentration greater than the given dopant concentration of the base substrate, and the second doped region has a dopant concentration less than the first doped region.

15 Claims, 2 Drawing Sheets

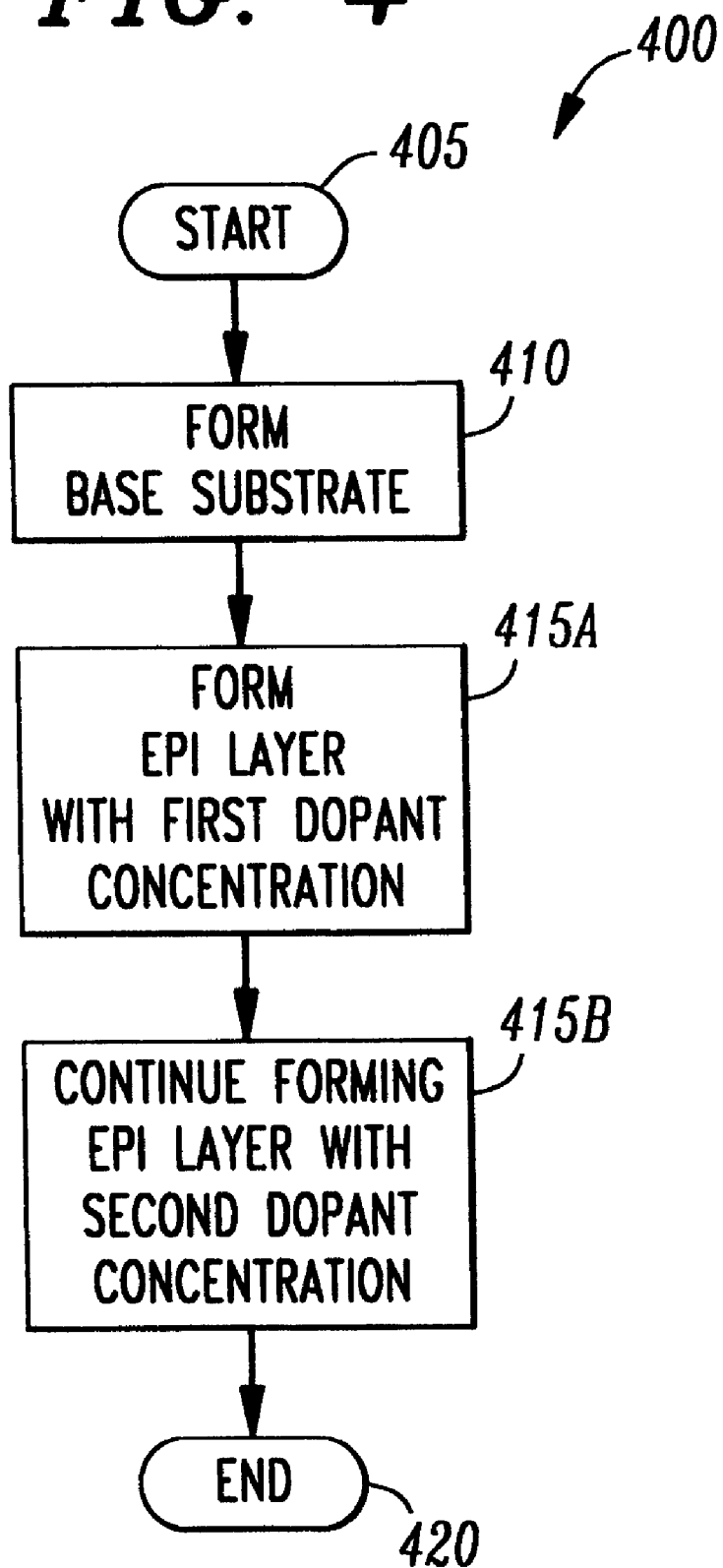

SIMPLIFIED HIGH Q INDUCTOR SUBSTRATE

TECHNICAL FIELD OF THE INVENTION

This Application is a Divisional of prior Application Ser. No. 09/386,132 filed on Aug. 30, 1999, now U.S. Pat. No. 6,225,182 currently pending, to Jerome T. Chu, et al. The above-listed Application is commonly assigned with the present invention and is incorporated herein by reference as if reproduced herein in its entirety under Rule 1.53(b).

The present invention is directed, in general, to semiconductor devices and, more specifically, to a semiconductor device having a simplified high Q inductor substrate and a method for manufacturing that substrate.

BACKGROUND OF THE INVENTION

Integrated circuits are critical to the success of many technology areas, and especially critical to the continued growth of the telecommunications industry. Semiconductor devices in the form of integrated circuits are the cornerstone of many telecommunications systems involving a broad spectrum of different circuits, many of which require high frequency capabilities. High frequency telecommunications circuits typically require the use of inductors to either tune a circuit to a particular desired frequency, to perform critical circuit functions such as maintaining a critical current flow, or to filter and eliminate undesired electrical noise from desired signals.

If a collection of inductors is needed to allow a particular integrated circuit device to perform correctly, the use of discrete inductors that are separate from the integrated circuit device may give rise to implementation problems due to the need for many interconnections. This situation has driven the industry to move in the direction of integrating as many of these needed inductors as possible into the semiconductor device itself. However, the integration of an inductor into a semiconductor device creates other problems due to the inductor's magnetic nature.

The magnetic field associated with a conductive coil forming an inductor is a well known donut or torus shaped structure, usually having an elliptical cross-section. This magnetic field alternates with the frequency applied to the inductor and may cause interfering effects within the semiconductor device itself. The generation of spurious currents due to this magnetic field may produce several undesirable effects. One of these is to reduce the effectiveness of the conductive coil's ability to perform as an inductor due to energy losses.

It is well known that the Q of an inductive circuit is a figure of merit that relates the energy stored to the energy dissipated or lost. High Q inductor circuits (a Q of 10 or greater) conserve sufficient energy to allow an appropriate inductive response. Alternately, low Q inductor circuits (a Q of three or less) lose a sufficient portion of the energy applied, often through the generation of eddy currents in the semiconductor device, causing them to perform poorly as inductive elements. Eddy currents are minimized in a semiconductor layer that corresponds to lower dopant concentrations thereby providing a layer having comparatively higher resistivity.

An example of an integrated circuit, that will not support a high Q inductor, has a highly conductive substrate and a highly resistive epitaxial (EPI) layer grown on the substrate. This integrated circuit is typical of a fundamental building block used in many current communications microchips. This substrate may have a positive dopant, such as boron, with a P+ dopant concentration that is typically greater than $10^{18} cm^{-3}$ making the substrate highly conductive electrically. The EPI layer also has a positive dopant but with a reduced or P- dopant concentration of about $10^{15} cm^{-3}$ making the EPI layer highly resistive.

The highly conductive substrate is used to prevent a functionally destructive phenomenon known as latch-up. Latch-up occurs when a voltage is applied to a semiconductor device in a direction opposite to the normal operating polarity. Latch-up is reduced in a semiconductor layer corresponding to higher dopant concentrations, which thereby provide a layer having comparatively higher conductivity (lower resistivity). A highly resistive substrate, however, would exacerbate the latch-up phenomenon.

High frequency communications microchips require that inductors be integrated into a microchip to achieve a required circuit performance and size, as stated earlier. If an integrated inductor were formed over the EPI layer under discussion, the inductor would induce eddy currents into the highly conductive substrate thereby incurring a large energy loss. To be energy efficient and therefore low loss, the integrated inductor would have to be formed over a highly resistive substrate. A semiconductor device, therefore, must incorporate trade-offs within its design to eliminate the generation of spurious currents and successfully accommodate integrated inductors. However, achievement of the required trade-offs currently requires many additional process steps in the construction of the semiconductor device thereby adding substantial manufacturing time and therefore cost to the semiconductor wafer.

Accordingly, what is needed in the art is a simplified and more cost-effective way to accommodate integrated inductors into semiconductor wafers.

SUMMARY OF THE INVENTION

To address the above-discussed deficiencies of the prior art, the present invention provides for a method of manufacturing a simplified high Q inductor substrate and a semiconductor device having that substrate. In one embodiment, the method for manufacturing the simplified high Q inductor substrate comprises forming a base substrate over a semiconductor wafer, wherein the base substrate has a given dopant concentration and then forming an epitaxial (EPI) layer over the base substrate that uniquely has differently doped regions. The EPI layer includes epitaxially forming a first doped region in the EPI layer over the base substrate and then epitaxially forming a second doped region in the EPI layer over the first doped region. The first doped region preferably has a dopant concentration greater than the given dopant concentration of the base substrate, and the second doped region has a dopant concentration less than the first doped region.

The present invention therefore introduces the broad concept of manufacturing a simplified high Q inductor substrate through the forming of the EPI layer containing at least two dopant concentrations. These differently doped regions provide a balance in the semiconductor device between maximizing the Q for an integrated inductor formed in the device and maintaining a required latch-up resistance for the device.

Forming the base substrate, in one embodiment of the present invention, includes doping the base substrate with a p-type dopant to a dopant concentration ranging from about $10^{14} cm^{-3}$ to about $10^{16} cm^{-3}$ wherein a dopant concentration of about $10^{15} cm^{-3}$ is typical.

In an embodiment to be illustrated and described, epitaxially forming an EPI layer includes epitaxially forming an EPI layer having first and second doped regions to a thickness ranging from about 3 μm to about 7 μm.

Epitaxially forming a first doped region in the EPI layer, in an alternate embodiment, includes doping the first doped region with a p-type dopant to a dopant concentration equal to or greater than about $10^{17}cm^3$. In a further aspect of this embodiment, a dopant concentration of about $10^{18}cm^{-3}$ is used, and the first doped region has a thickness ranging from about 0.5 μm to about 2 μm.

In yet another embodiment of the present invention, epitaxially forming a second doped region over the first doped region includes doping the second doped region with a p-type dopant to a dopant concentration ranging from about $10^{14}cm^{-3}$ to about $10^{16}cm^{-3}$ wherein a dopant concentration of about $10^{15}cm^{-3}$ is typical. The second doped region has a thickness ranging from about 3 μm to about 5 μm.

In another aspect, the present invention provides a semiconductor wafer that comprises a base substrate that is formed over a semiconductor wafer and that has a given dopant concentration. An epitaxial (EPI) layer is formed over the base substrate, which includes at least first and second doped regions. The first doped region is located over the base substrate and has a dopant concentration greater than the given dopant concentration of the base substrate. The second doped region is located over the first doped region and has a dopant concentration less than the first doped region. While two doped regions have been specifically set forth, those who are skilled in the art will appreciate that other embodiments of the present invention could provide for more than two differently doped regions within the EPI layer.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 4 illustrates a flow diagram of a method that may be used to construct the integrated circuit wafer of FIG. 2.

DETAILED DESCRIPTION

Figure 1:
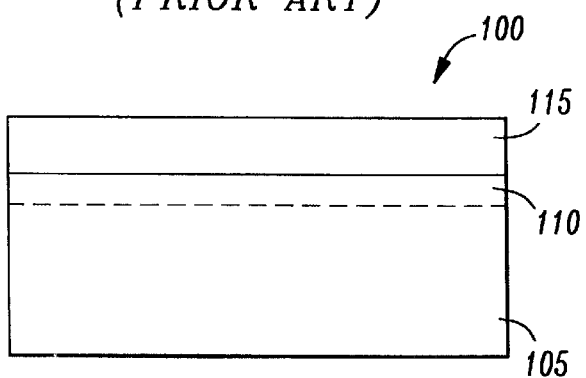
FIG. 1 illustrates a diagram showing a prior art construction of an integrated circuit wafer that will support a high Q inductor.

Referring initially to FIG. 1, illustrated is a diagram showing a prior art construction of an integrated circuit wafer 100 that will support a high Q inductor. The integrated circuit wafer 100 includes a substrate 105, an induced layer 110 and an EPI layer 115. The substrate 105 has a positive dopant with a P- dopant concentration that is typically about $10^5cm^{-3}$ making the substrate 105 highly resistive electrically. The induced layer 110 is a thin, highly conductive layer that is constructed by diffusing or implanting a P+ dopant into the substrate 105. A P+ dopant concentration of $10^{18}cm^{-3}$ is typical. The EPI layer 115 is then grown on the induced layer 110 and has a P- dopant concentration of about $10^{15}cm^{-3}$.

A typical diffusion process which may be used to form the induced layer 110 includes the following steps: 1) Brush scrub cleaning, 2) 100:1 HF cleaning, 3) Deposit solid diffusion source, 4) Deposit cap layer, 5) Drive in dopants,, 6) Remove solid diffusion source, and 7) Clean wafer for EPI growth.

A typical implantation process which may also be used to form the induced layer 110 includes the following steps: 1) Brush scrub cleaning, 2) 100:1 HF cleaning, 3) Implant dopants, 4) Drive in dopants, and 5) Clean wafer for EPI growth.

The integrated circuit wafer 100 provides a structure that will both support a high Q integrated inductor and prevent a latch-up condition. The substrate 105 is highly resistive and therefore does not support eddy currents that would lead to energy loss and low Q inductor circuit situations. Additionally, the induced layer 110, being highly conductive, prevents latch-up from occurring. Since the induced layer 110 is thin, it will also not support sufficient eddy current activity to cause low Q inductor current situations, as well. Unfortunately, however, the process steps needed to construct the induced layer are many and therefore both time consuming and costly.

Figure 2:
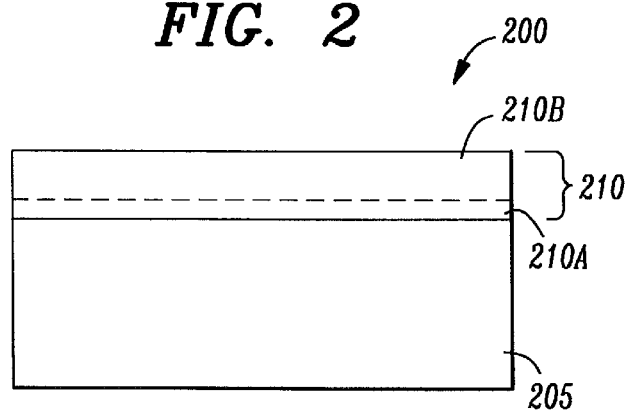
FIG. 2 illustrates a diagram showing an embodiment of an integrated circuit wafer that will support a high Q inductor constructed according to the principles of the present invention.

Turning now to FIG. 2, illustrated is a diagram showing an embodiment of an integrated circuit wafer 200 that will support a high Q inductor constructed according to the principles of the present invention. The integrated circuit wafer 200 includes a base substrate 205 and an EPI layer 210 having first and second doped regions 210A, 210B, which are preferably formed by an epitaxial process.

The present invention includes the semiconductor wafer 200 that comprises the base substrate 205 having a given dopant concentration that is formed over the semiconductor wafer 200. The EPI layer 210 is preferably expitaxially formed over the base substrate 205, which includes first and second doped regions 210A, 210B. The first doped region 210A is located over the base substrate 205 and has a dopant concentration greater than the given dopant concentration of the base substrate 205. The second doped region 210B is located over the first doped region 210A and has a dopant concentration less than the first doped region 210A.

In one embodiment, the first doped region 210A may be formed by using 120 ppm boron source directly fed into one dopant controller and which is then mixed with trichlorosilane (TCS) and flowed at a rate of about 5 liters/minute. The EPI layer 210 is grown at a temperature of about 1150° C. The second doped region 210B may be formed by removing the 120 ppm boron source while maintaining the TCS flow at 5 liters/minute at about 1150° C.

The present invention therefore introduces the broad concept of manufacturing a simplified high Q inductor substrate through the forming of the EPI layer 210 containing at least two dopant concentrations. These differently doped regions 210A, 210B provide a balance in the semiconductor device between maximizing the Q for an integrated inductor formed in the device and maintaining a required latch-up resistance for the device. While the two doped regions 210A, 210B have been specifically set forth in this embodiment, those who are skilled in the art will appreciate that other embodiments of the present invention could provide for more than two differently doped regions within the EPI layer 210.

Forming the base substrate 205 in this embodiment of the present invention includes doping the base substrate 205 with a p-type dopant to a dopant concentration ranging from about $10^{14}cm^{-3}$ to about $10^{16}cm^{-3}$ wherein a dopant concentration of about $10^{15}cm^{-3}$ is preferred. Then, the EPI layer 210 is epitaxially formed having first and second doped regions 210A, 210B to a thickness ranging from about 3 $\mu$m to about 7 $\mu$m. The first doped region 210A has a thickness ranging from about 0.5 $\mu$m to about 2 $\mu$m, and the second doped region 210B has a thickness ranging from about 3 $\mu$m to about 5 $\mu$m.

Epitaxially forming the first doped region 210A in the EPI layer 210 includes doping the first doped region 210A with a p-type dopant to a dopant concentration equal to or greater than about $10^{17}cm^{-3}$ wherein a dopant concentration of about $10^{18}cm^{-3}$ is preferably achieved. Then epitaxially forming the second doped region 210B over the first doped region 210A includes doping the second doped region 210B with a p-type dopant to a dopant concentration ranging from about $10^{14}cm^{-3}$ to about $10^{16}cm^{-3}$ wherein a dopant concentration of about $10^{15}cm^{-3}$ is preferred.

Therefore, the base substrate 205 is highly resistive electrically, the first doped region 210A of the EPI layer 210 is highly conductive and the second doped region 210B of the EPI layer 210 is highly resistive. The integrated circuit wafer 200 affords a structure that will both support a high Q integrated inductor and prevent a latch-up condition as seen in the prior art example of FIG. 1. However, epitaxially forming the EPI layer 210 using two differently doped regions allows the structure to be constructed using basically only one additional process step wherein only the dopant concentration is reduced to form the second doped region 210B. The time at which the dopant concentration is reduced, and the amount of the dopant concentration reduction determine the thickness of the first doped region 210A and the resistivity of the second doped region 210B, respectively. This process may be accomplished much more quickly, easily and cost effectively than the diffusion or the implantation processes used in the example of FIG. 1.

Figure 3:
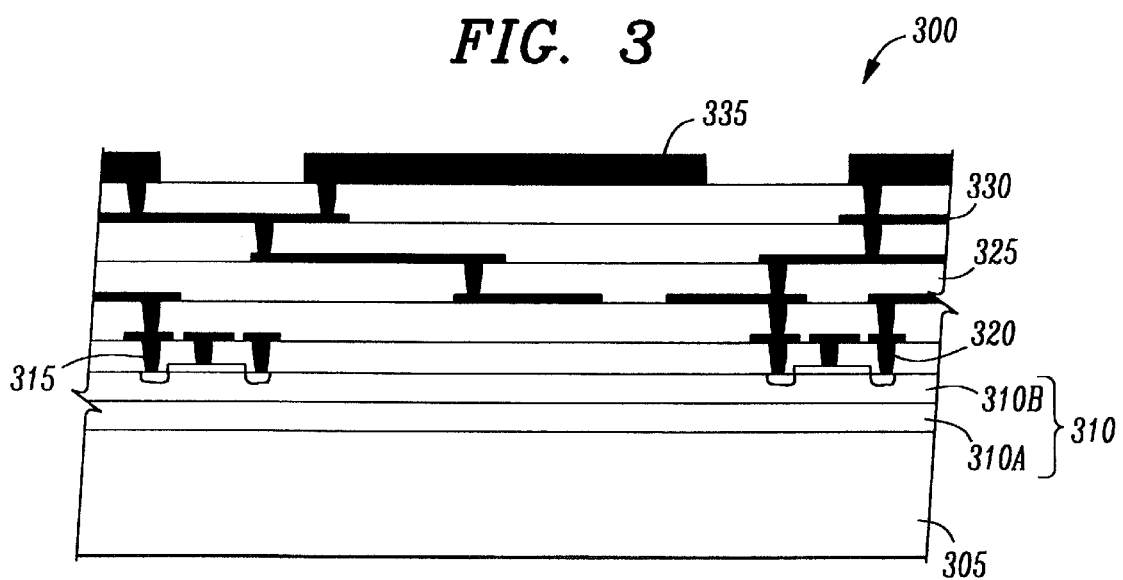
FIG. 3 illustrates a diagram showing an embodiment of an integrated circuit wafer constructed according to the principles of the present invention having a high Q thick metal inductor.

Turning now to FIG. 3, illustrated is a diagram showing an embodiment of an integrated circuit wafer 300 constructed according to the principles of the present invention having a high Q thick metal inductor. The integrated circuit wafer 300 includes a base substrate 305, an EPI layer 310 having first and second doped regions 310A, 310B, first and second field effect transistors (FETs) 315, 320 having sources, drains and interposed gates, an inter-level dielectric region 325 having metal interconnections 330 and a thick metal inductor 335.

The integrated circuit wafer 300 employs the first doped region 310A of the EPI layer 310, which is highly conductive and the second doped region 310B of the EPI layer 310, which is highly resistive to afford a structure that will both support a high Q integrated inductor and prevent a latch-up condition as seen in FIG. 2. The thick metal inductor 335 is located well "up-level" from the first and second FETs 315, 320 and is connected to other appropriate circuit components through the metal interconnections 330 in the inter-level dielectric region 325.

Turning now to FIG. 4, illustrated is a flow diagram of a method 400 that may be used to construct the integrated circuit wafer 200 of FIG. 2. The method 400 of manufacturing a simplified high Q inductor substrate starts in a step 405 and continues in a step 410 with the forming of a base substrate over a semiconductor wafer. The base substrate formed in the step 410 has a given dopant concentration ranging from about $10^{14}cm^{-3}$ to about $10^{16}cm^{-3}$ wherein a dopant concentration of about $10^{15}cm^{-3}$ is typical. Then, an EPI layer is formed over the base substrate to a thickness ranging from about 3 $\mu$m to about 7 $\mu$m in steps 415A and 415B, that uniquely has differently doped regions.

The EPI layer includes epitaxially forming a first doped region in the EPI layer in the step 415A over the base substrate and then epitaxially forming a second doped region in the EPI layer over the first doped region in the step 415B. The first doped region formed in the step 415A has a dopant concentration greater than the given dopant concentration of the base substrate formed in the step 410. The first doped region has a dopant concentration equal to or greater than about $10^{17}cm^{-3}$, where a dopant concentration of about $10^{18}cm^{-3}$ is typical. The first doped region has a thickness ranging from about 0.5 $\mu$m to about 2 $\mu$m.

The second doped region in the EPI layer formed in the step 415B has a dopant concentration less than the first doped region.

The second doped region has a dopant concentration ranging from about $10^{14}cm^{-3}$ to about $10^{16}cm^{-3}$ wherein a dopant concentration of about $10^{15}cm^{-3}$ is typical. The second doped region has a thickness ranging from about 3 $\mu$m to about 5 $\mu$m.

The thickness of the first doped region of the EPI layer formed in the steps 415A and 415B is determined by a first length of time that the first dopant concentration is applied. Then, the dopant concentration is reduced and the growth of the EPI layer is continued for a second length of time to determine the thickness of the second doped region. The method 400 ends in a step 420 when the second length of time is complete. The method 400 of using a single EPI layer with two separate doped regions greatly simplifies the manufacture of a structure, that will support a high Q integrated inductor while inhibiting latch-up, as compared to the current use of a diffusion or implantation process.

Although the present invention has been described in detail, those skilled in the art should understand that they can make various changes, substitutions and alterations herein without departing from the spirit and scope of the invention in its broadest form.

What is claimed is:
1. A semiconductor wafer, comprising:
    a base substrate over a semiconductor wafer, the base substrate having a given dopant concentration;
    an epitaxial (EPI) layer over the base substrate, including:
        an epitaxially formed first doped region located over the base substrate, the first doped region having a dopant concentration greater than the given dopant concentration of the base substrate; and
        an epitaxially formed second doped region located over the first doped region, the second doped region having a dopant concentration less than the first doped region.
2. The semiconductor wafer as recited in claim 1 further comprising an integrated circuit having an inductor incorporated therein.

3. The semiconductor wafer as recited in claim 1 wherein the base substrate has a p-type dopant.

4. The semiconductor wafer as recited in claim 1 wherein the base substrate is doped to a concentration ranging from about $10^{14} cm^{-3}$ to about $10^{16} cm^{-3}$.

5. The semiconductor wafer as recited in claim 4 wherein the base substrate is doped to a concentration of about $10^{15} cm^{-3}$ with a p-type dopant.

6. The semiconductor wafer as recited in claim 1 wherein the epitaxially formed first doped region is doped with a p-type dopant.

7. The semiconductor wafer as recited in claim 1 wherein the epitaxially formed first doped region is doped to a concentration equal to or greater than about $10^{17} cm^{-3}$.

8. The semiconductor wafer as recited in claim 6 wherein the first doped region is doped to a concentration of about $10^{18} cm^{-3}$ with a p-type dopant.

9. The semiconductor wafer as recited in claim 1 wherein the epitaxially formed second doped region is doped with a p-type dopant.

10. The semiconductor wafer as recited in claim 1 wherein the epitaxially formed second doped region is doped to a concentration ranging from about $10^{14} cm^{-3}$ to about $10^{16} cm^{-3}$.

11. The semiconductor wafer as recited in claim 10 wherein the second doped region is doped to a concentration of about $10^{15} cm^{-3}$ with a p-type dopant.

12. The semiconductor wafer as recited in claim 1 wherein the epitaxially formed EPI layer has a thickness ranging from about 3 $\mu$m to about 7 $\mu$m.

13. The semiconductor wafer as recited in claim 1 wherein the epitaxially formed first doped region has a thickness ranging from about 0.5 $\mu$m to about 2 $\mu$m.

14. The semiconductor wafer as recited in claim 1 wherein the epitaxially formed second doped region has a thickness ranging from about 3 $\mu$m to about 5 $\mu$m.

15. The semiconductor wafer as recited in claim 1 wherein the epitaxially formed first doped region provides a Q equal to or greater than about 10.

* * * * *